(12) United States Patent
Kimura et al.

(10) Patent No.: US 11,923,820 B2
(45) Date of Patent: Mar. 5, 2024

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Shou Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 383 days.

(21) Appl. No.: 17/345,238

(22) Filed: Jun. 11, 2021

(65) Prior Publication Data

US 2021/0305964 A1  Sep. 30, 2021

Related U.S. Application Data

(63) Continuation of application No. PCT/JP2019/047903, filed on Dec. 6, 2019.

(30) Foreign Application Priority Data

Dec. 13, 2018  (JP) .................................. 2018-233575

(51) Int. Cl.
*H03H 9/02* (2006.01)

(52) U.S. Cl.
CPC .... *H03H 9/02015* (2013.01); *H03H 9/02157* (2013.01); *H03H 9/02228* (2013.01); *H03H 9/02574* (2013.01)

(58) Field of Classification Search
None
See application file for complete search history.

(56) References Cited

U.S. PATENT DOCUMENTS

| | | |
|---|---|---|
| 2004/0222717 A1 | 11/2004 | Matsuda et al. |
| 2012/0176001 A1* | 7/2012 | Kadota .............. H03H 9/02559 310/313 A |
| 2012/0194032 A1* | 8/2012 | Kadota .............. H03H 9/02559 310/313 A |
| 2013/0285768 A1 | 10/2013 | Watanabe et al. |
| 2014/0225684 A1 | 8/2014 | Kando et al. |

(Continued)

FOREIGN PATENT DOCUMENTS

| | | |
|---|---|---|
| CN | 102549923 A | 7/2012 |
| CN | 103891139 A | 6/2014 |
| JP | 2004-336503 A | 11/2004 |

(Continued)

OTHER PUBLICATIONS

Official Communication issued in International Patent Application No. PCT/JP2019/047903, dated Jan. 28, 2020.

(Continued)

*Primary Examiner* — Kenneth B Wells
(74) *Attorney, Agent, or Firm* — Keating & Bennett, LLP

(57) ABSTRACT

An acoustic wave device includes a support substrate, a piezoelectric layer, and an IDT electrode. The piezoelectric layer is directly or indirectly provided on the support substrate. The IDT electrode includes a plurality of electrode fingers and is provided on a main surface of the piezoelectric layer. The thickness of the piezoelectric layer is about 1λ or less when a wavelength of an acoustic wave determined by an electrode finger period of the IDT electrode is defined as λ. The support substrate is an A-plane sapphire substrate.

15 Claims, 9 Drawing Sheets

(56) References Cited

U.S. PATENT DOCUMENTS

2019/0319603 A1\* 10/2019 Kadota ............. H03H 9/02574

FOREIGN PATENT DOCUMENTS

| TW | 201826580 A | 7/2018 |
| --- | --- | --- |
| WO | 2011/037145 A1 | 3/2011 |
| WO | 2012/086639 A1 | 6/2012 |
| WO | 2013/061926 A1 | 5/2013 |

OTHER PUBLICATIONS

First Office Action in CN201980080936.0, dated Jul. 13, 2023, 8 pages.

\* cited by examiner

ACOUSTIC WAVE DEVICE

CROSS REFERENCE TO RELATED APPLICATIONS

This application claims the benefit of priority to Japanese Patent Application No. 2018-233575 filed on Dec. 13, 2018 and is a Continuation Application of PCT Application No. PCT/JP2019/047903 filed on Dec. 6, 2019. The entire contents of each application are hereby incorporated herein by reference.

BACKGROUND OF THE INVENTION

1. Field of the Invention

The present invention generally relates to an acoustic wave device, and more particularly, to an acoustic wave device using an acoustic wave.

2. Description of the Related Art

An acoustic wave device including a support substrate, a high acoustic velocity film in which an acoustic velocity is relatively high, a low acoustic velocity film in which an acoustic velocity is relatively low, a piezoelectric film, and an interdigital transducer (IDT) electrode has been known (refer to International Publication No. 2012/086639, for example).

The high acoustic velocity film is laminated on the support substrate, and the low acoustic velocity film is laminated on the high acoustic velocity film. The piezoelectric film is laminated on the low acoustic velocity film. Disposing the low acoustic velocity film between the high acoustic velocity film and the piezoelectric film makes it possible to reduce the loss of acoustic wave energy and to increase a Q factor.

In the case in which the main component of an acoustic wave propagating in an acoustic wave device disclosed in International Publication No. 2012/086639 is a longitudinal wave, the loss of acoustic wave energy may be larger than that in the case in which an acoustic wave whose main component is a transversal wave propagates, depending on the material and the orientation of a support substrate. Accordingly, there is a problem that the Q factor is low. In other words, a preferable impedance characteristic may not be obtained.

SUMMARY OF THE INVENTION

Preferred embodiments of the present invention provide acoustic wave devices that are each capable of obtaining a preferable impedance characteristic when an acoustic wave propagates through a piezoelectric layer.

An acoustic wave device according to a preferred embodiment of the present invention includes a support substrate, a piezoelectric layer, and an IDT electrode. The piezoelectric layer is directly or indirectly provided on the support substrate. The IDT electrode includes a plurality of electrode fingers and is provided on a main surface of the piezoelectric layer. The thickness of the piezoelectric layer is about 1λ or less when the wavelength of an acoustic wave determined by an electrode finger period of the IDT electrode is defined as λ. The support substrate is an A-plane sapphire substrate.

With preferred embodiments of the present invention, a preferable impedance characteristic may be obtained even in a case that the main component of a propagating acoustic wave is a longitudinal wave.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments and modifications described below are merely examples of the present invention, and the present invention is not limited to the preferred embodiments and modifications. In addition to the following preferred embodiments and modifications, various modifications can be made in accordance with a design or the like without departing from the technical scope of the present invention.

Preferred Embodiment

Hereinafter, an acoustic wave device according to a present preferred embodiment of the present invention will be described with reference to FIG. 1 to FIG. 7.

Figure 1:
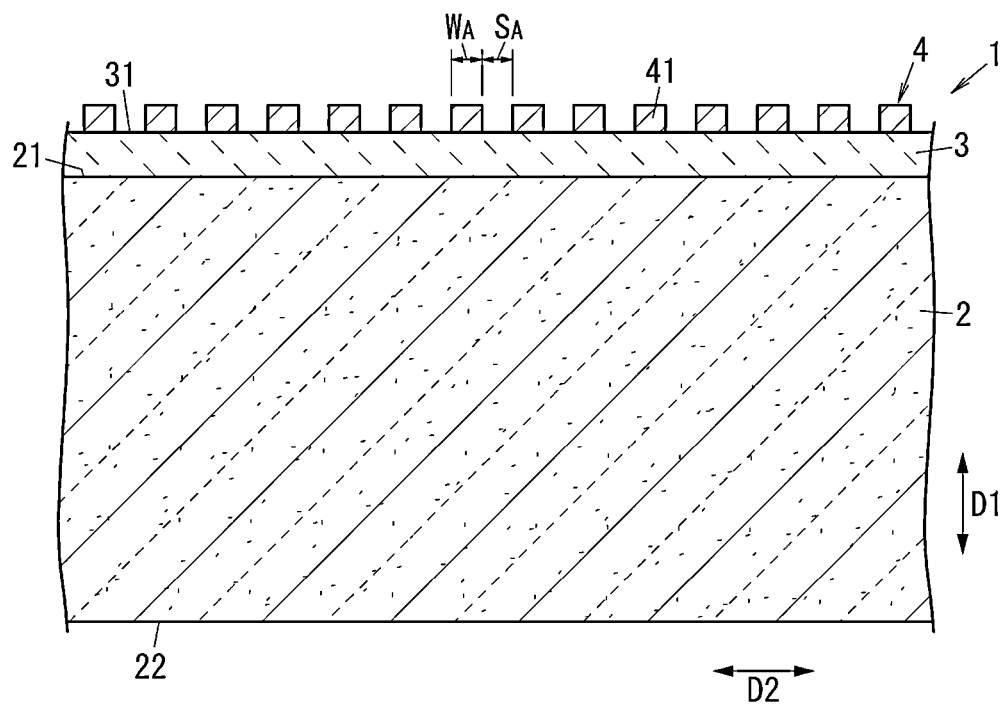
FIG. 1 is a sectional view of an acoustic wave device according to a preferred embodiment of the present invention.
Figure 8:
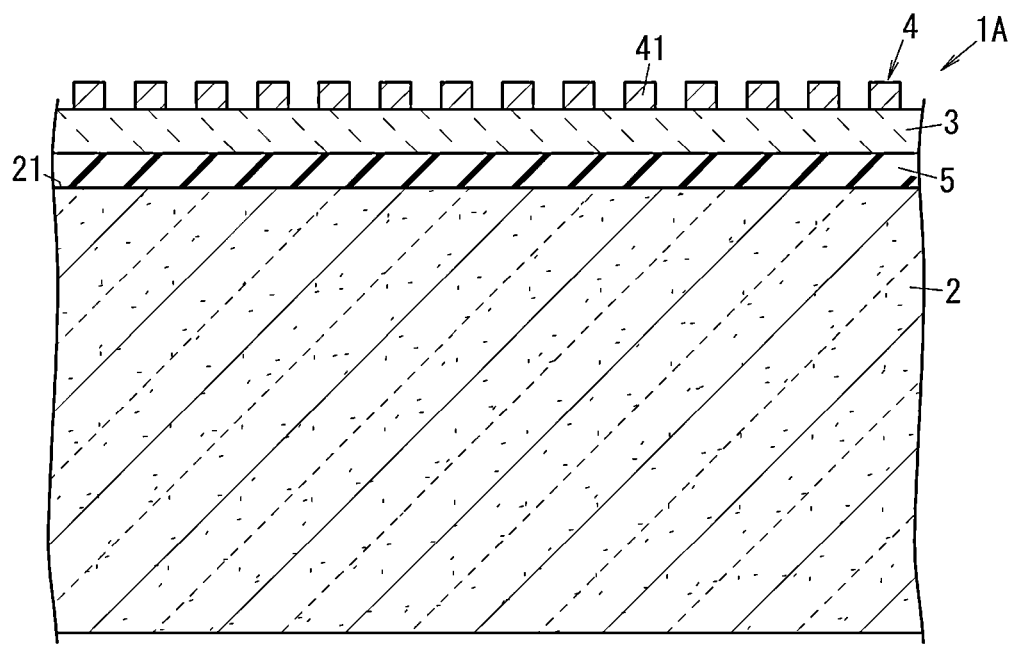
FIG. 8 is a sectional view of an acoustic wave device according to Modification 1 of a preferred embodiment of the present invention.
Figure 10:
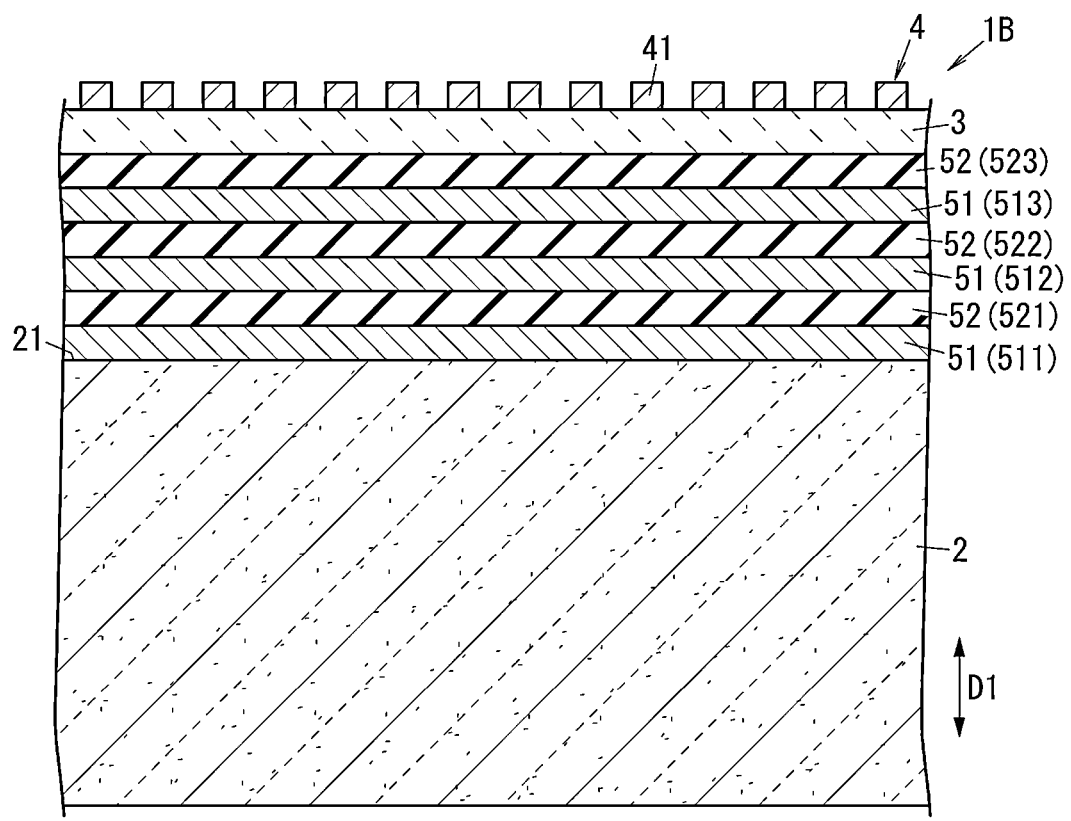
FIG. 10 is a sectional view of an acoustic wave device according to Modification 2 of a preferred embodiment of the present invention.

FIG. 1, FIG. 8, and FIG. 10 referred to in the following descriptions of preferred embodiments or the like are all schematic diagrams, and each of the ratios of the sizes and thicknesses of components in the drawings does not necessarily reflect the actual dimensional ratio.

(1) Overall Configuration of Acoustic Wave Device

An acoustic wave device 1 according to a preferred embodiment of the present invention is an acoustic wave device using, for example, a plate wave as an acoustic wave. The acoustic wave device 1 includes a support substrate 2, a piezoelectric layer 3, and an interdigital transducer (IDT) electrode 4 defined by a comb-shaped electrode, as illustrated in FIG. 1. The piezoelectric layer 3 is provided on the support substrate 2. The IDT electrode 4 is provided on the piezoelectric layer 3.

(2) Components of Acoustic Wave Device

Next, components of the acoustic wave device 1 will be described with reference to the drawings.

(2.1) Support Substrate

The support substrate 2 supports a multilayer body including the piezoelectric layer 3 and the IDT electrode 4 as illustrated in FIG. 1. The support substrate 2 includes a first main surface 21 and a second main surface 22 that are opposed to each other in a thickness direction D1 (hereinafter also referred to as first direction D1). The first main surface 21 and the second main surface 22 face away from each other. The shape in plan view of the support substrate 2 (outer peripheral shape when support substrate 2 is viewed from the thickness direction D1) is a rectangular or substantially rectangular shape but is not limited to the rectangular or substantially shape and may be, for example, a square or substantially square shape.

The support substrate 2 is an A-plane sapphire substrate. Here, the A-plane sapphire substrate refers to a sapphire substrate in which the first main surface 21 is the A-plane of sapphire. The crystal structure of sapphire is a rhombohedral system but may be approximated by a hexagonal system. Further, sapphire is an anisotropic material. The A-plane sapphire substrate is expressed as (11-20) in terms of a plane index and is expressed as (about 90°, about 90°, Iv) in terms of Euler angles. Note that Euler angles of sapphire may be, for example, (90°±5°, 90°±5°, ψ).

In the present preferred embodiment, ψ is preferably within the range of about 120° or more and about 165° or less, for example.

(2.2) Piezoelectric layer

The piezoelectric layer 3 is made of, for example, an X-cut Y-propagation lithium niobate (LiNbO$_3$) piezoelectric single crystal. When three crystal axes of the LiNbO$_3$ piezoelectric single crystal are defined as an X axis, a Y axis, and a Z axis, the X-cut Y-propagation LiNbO$_3$ piezoelectric single crystal is a LiNbO$_3$ single crystal cut by a plane whose normal line lies along the axis rotated from the X axis to the Z axis with the Y axis as the central axis. The X-cut Y-propagation LiNbO$_3$ piezoelectric single crystal is a single crystal in which a surface acoustic wave propagates in the Y axis direction. In the present preferred embodiment, Euler angles of the piezoelectric layer 3 are (φ, θ, ψ). Euler angles of the piezoelectric layer 3 include crystallographically equivalent Euler angles. Since LiNbO$_3$ is a crystal belonging to the trigonal system 3m point group, the following equation is satisfied.

$$F(\theta,\varphi,\psi)=F(60°+\theta,-\varphi,\psi)=F(60°-\theta,-\varphi,180°-\psi)=F(\theta,180°+\varphi,180°-\psi)=F(\varphi,\theta,180°+\psi)$$

The piezoelectric layer 3 is not limited to the X-cut Y-propagation LiNbO$_3$ piezoelectric single crystal and may be, for example, an X-cut Y-propagation LiNbO$_3$ piezoelectric ceramics.

The piezoelectric layer 3 is provided on the first main surface 21 of the support substrate 2. The thickness of the piezoelectric layer 3 (length in the first direction D1) is about 1λ or less, for example, when the wavelength of an acoustic wave determined by an electrode finger period of the IDT electrode 4 is defined as λ. With this, in the acoustic wave device 1, the plate wave is excited by the IDT electrode 4 and the plate wave propagates. In the acoustic wave device 1 of the present preferred embodiment, the wavelength of the acoustic wave is about 1 μm and the thickness of the piezoelectric layer 3 is about 0.2 for example. Setting the thickness of the piezoelectric layer 3 to about 1λ or less causes the Q factor to be increased. Further, adjusting of the acoustic velocity of the acoustic wave may be easily accomplished.

Euler angles of the piezoelectric layer 3 in the present preferred embodiment are, for example, (about 90°, about 90°, about) 40°). That is, the piezoelectric layer 3 of the present preferred embodiment is made of an X-cut 40° Y-propagation LiNbO$_3$ piezoelectric single crystal, for example.

Note that, an example of the piezoelectric layer 3 has a crystal orientation of (about 90°, about 90°, about 40°) in a representation of Euler angles. Meanwhile, the crystal orientation of the piezoelectric layer 3 is not limited thereto. A substrate having Euler angles (about 90°, about 90°, ψ) is an X-cut substrate, a surface acoustic wave in which a longitudinal wave is dominant is excited on the X-cut substrate, and an electromechanical coupling coefficient varies in accordance with ψ. Accordingly, any crystal orientation of the piezoelectric layer 3 may be chosen depending on a desired electromechanical coupling coefficient. For example, when ψ is in the range of about 40°±20°, a relatively large electromechanical coupling coefficient may be obtained. Similarly, for example, also when φ is in the range of about 90°±5° or θ is in the range of about 90°±5°, a relatively large electromechanical coupling coefficient may be obtained. That is, Euler angles of the piezoelectric layer 3 may be determined in the range of (about 90°±5°, about 90°±5°, about 40°±20°), for example. Further, in the present preferred embodiment, the longitudinal wave is an acoustic wave having an acoustic velocity of about 6000 m/s or more and about 7000 m/s or less, for example.

In the acoustic wave device 1, modes of an acoustic wave propagating through the piezoelectric layer 3 include, for example, a longitudinal wave, an SH wave, an SV wave, or a mode combining them. In the acoustic wave device 1, a mode in which a longitudinal wave is a main component is used as a main mode. Whether or not the mode of the acoustic wave propagating through the piezoelectric layer 3 is "a main mode in which a longitudinal wave is a main component" may be confirmed by a strain analysis. The strain analysis is performed by analyzing a displacement distribution by a finite element method using, for example, parameters (material, Euler angles, thickness, and the like) of the piezoelectric layer 3, and parameters (material, thickness, electrode finger period, and the like) of the IDT electrode 4. Euler angles of the piezoelectric layer 3 may be determined by an analysis.

In a case that the acoustic wave device 1 is a resonator, the main mode referred to is a mode of a wave in which: at least one of a resonant frequency and an anti-resonant frequency is present in a pass band of a filter; and a difference between impedance at the resonant frequency and impedance at the anti-resonant frequency is largest. In a case that the acoustic wave device 1 is a filter, the main mode is a mode of a wave used to define a pass band of the filter.

(2.3) IDT Electrode

The IDT electrode 4 includes a plurality of electrode fingers 41 and two busbars (not illustrated), and is provided on a main surface 31 of the piezoelectric layer 3. The plurality of electrode fingers 41 are disposed side by side while being spaced apart from each other in a second direction D2, which is orthogonal or substantially orthogonal to the first direction D1. The two busbars (not illustrated) have an elongated shape with a longitudinal direction coinciding with the second direction D2 and are electrically connected to the plurality of electrode fingers 41. In particular, the plurality of electrode fingers 41 include a plurality of first electrode fingers and a plurality of second electrode fingers. The plurality of first electrode fingers are electrically connected to a first busbar of the two busbars. The plurality of second electrode fingers are electrically connected to a second busbar of the two busbars.

When the first electrode finger and the second electrode finger have a width $W_A$ (refer to FIG. 1), and the first electrode finger and the second electrode finger adjacent to each other have a space width $S_A$, a duty ratio is defined as $W_A/(W_A+S_A)$ in the IDT electrode 4. The duty ratio of the IDT electrode 4 is about 0.5, for example. When the wavelength of the acoustic wave determined by the electrode finger period of the IDT electrode 4 is defined as λ, the wavelength λ is equal or substantially equal to the electrode finger period. The electrode finger period of the IDT electrode 4 is defined by a repetition period of the plurality of first electrode fingers and the plurality of second electrode fingers. Accordingly, the repetition period and the wavelength λ are equal or substantially equal to each other. The duty ratio of the IDT electrode 4 is a ratio of the width $W_A$ of the first electrode finger or the second electrode finger to a value $(W_A+S_A)$ of half of the electrode finger period.

The material of the IDT electrode 4 is an appropriate metal material such, for example, as aluminum (Al), copper (Cu), platinum (Pt), gold (Au), silver (Ag), titanium (Ti), nickel (Ni), chromium (Cr), molybdenum (Mo), or tungsten (W), or an alloy including any of these metals as a main component. The IDT electrode 4 may have a structure in which a plurality of metal films made of these metals or alloys are laminated. In the present preferred embodiment, the material of the IDT electrode 4 is copper, for example. The thickness of the IDT electrode 4 (length in the first direction D1) is about 50 nm, for example.

Further, a protective film or a frequency adjusting film may cover at least a portion of the IDT electrode 4.

(3) Characteristics of Acoustic Wave Device

Figure 2:
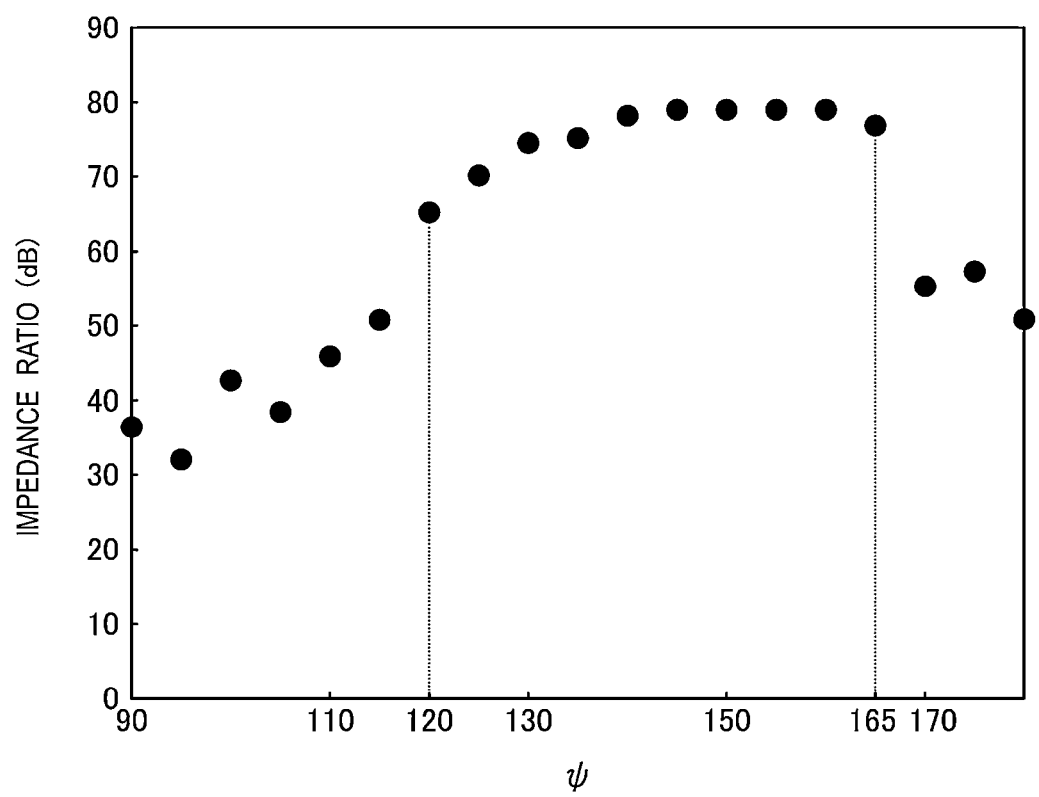
FIG. 2 is a graph describing a relationship between the impedance ratio of the acoustic wave device and $\psi$.

FIG. 2 is a graph showing a relationship between ψ and an impedance ratio in a case that the acoustic wave device 1 is used as a one-port resonator. In the graph, the angle of ψ, which is one element of Euler angles of the support substrate 2, is varied.

Impedance [dB] is a value obtained by $20 \times \log_{10}|Z|$, where Z is the impedance of the acoustic wave device 1. The impedance ratio is a value obtained by the equation "impedance ratio=$(20 \times \log_{10}|Z1|)-(20 \times \log_{10}|Z2|)$". Here, Z2 is the impedance of the acoustic wave device 1 at the resonant frequency. Further, Z1 is the impedance of the acoustic wave device 1 at the anti-resonant frequency.

The impedance ratio represents an index of the magnitude of a resonant response, and the impedance at the resonant frequency is more preferable as the value of the impedance ratio is larger. As shown in FIG. 2, the impedance ratio exceeds about 60 [dB] when ψ is in the range of about 120° or more and about 165° or less. Accordingly, when ψ is in the range of about 120° or more and about 165° or less, the impedance at the resonant frequency is preferable.

Figure 3:
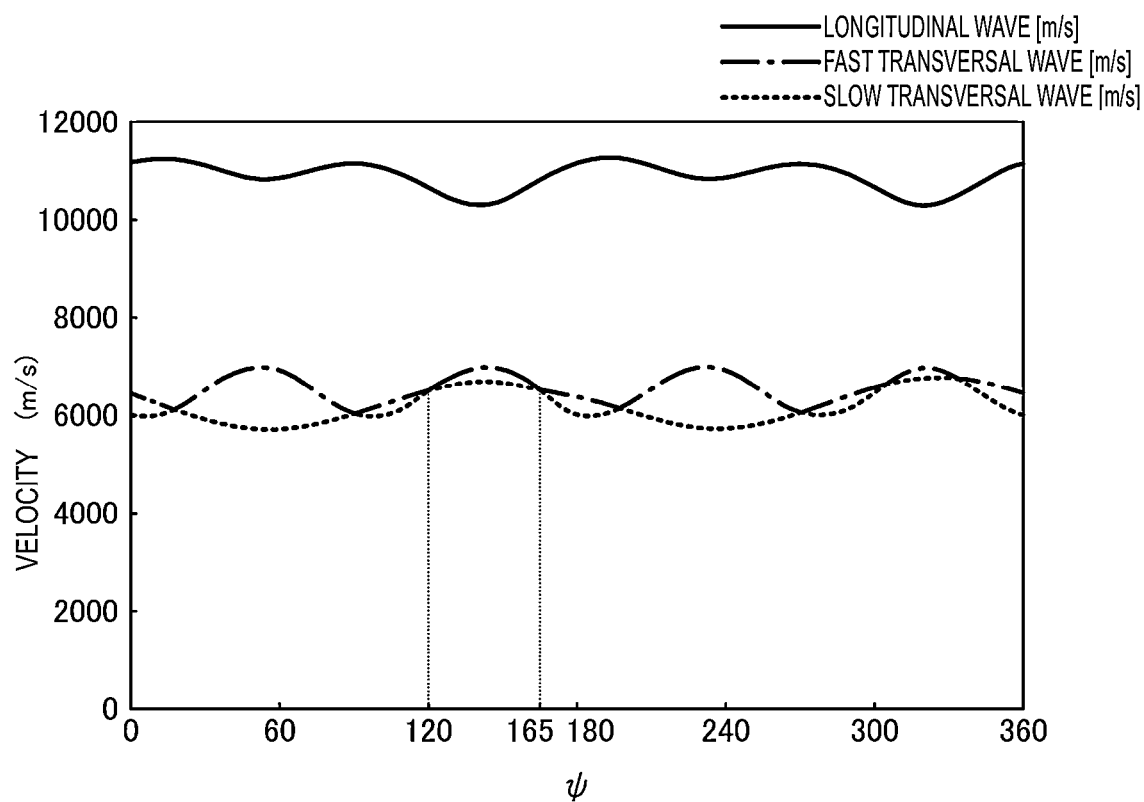
FIG. 3 is a graph describing a bulk wave acoustic velocity when $\psi$ of a support substrate, which is an A-plane sapphire substrate, included in the acoustic wave device is varied.

In FIG. 3, a bulk wave acoustic velocity is shown where ψ of the A-plane sapphire substrate (support substrate 2) is varied. Specifically, a relationship between a phase velocity and ψ is shown. Since sapphire is an anisotropic material, unlike bulk wave acoustic velocities of a longitudinal wave and a transversal wave, the transversal wave of a high velocity mode (fast transversal wave) and the transversal wave of a low velocity mode (slow transversal wave) propagate. That is, the acoustic bulk wave propagating through the A-plane sapphire substrate includes a longitudinal wave, a fast transversal wave, and a slow transversal wave. The velocity of these waves depends on ψ.

As shown in FIG. 3, the acoustic velocity of the longitudinal wave exceeds the velocity of about 10000 m/s regardless of the value of ψ. Whereas, the acoustic velocity of each of the fast transversal wave and the slow transversal wave is around the velocity of about 6000 m/s. Here, in the range (range of about 120° or more and about 165° or less, for example) of ψ in which the impedance at the resonant frequency is preferable, both of the fast transversal wave and the slow transversal wave have about 6600 m/s or more, and the acoustic velocity becomes peculiarly high in the A-plane sapphire substrate.

In the present preferred embodiment, the acoustic velocity at the resonant frequency point of the acoustic wave mode of a longitudinal wave type is, for example, about 6000 m/s and is smaller than about 6600 m/s of the acoustic velocity at the anti-resonant frequency point. Therefore, when the acoustic velocity in A-plane sapphire substrate is higher than the acoustic velocity at the resonant frequency point and the anti-resonant point, acoustic wave energy does not leak to the side of the A-plane sapphire substrate (support substrate 2) between the resonant frequency and the anti-resonant frequency, and the acoustic wave propagates in a state that the energy is concentrated in the vicinity of the piezoelectric layer 3. Accordingly, a preferable impedance characteristic (impedance ratio) is obtained. That is, a preferable characteristic of a surface acoustic wave may be obtained.

Also in a range (range of about 300° or more and about 345° or less) crystallographically equivalent to a range (range of about 120° or more and about 165° or less) of ψ in which the impedance is preferable, both of the fast transversal wave and the slow transversal wave have about 6600 m/s or more. Accordingly, a preferable impedance characteristic may be obtained also when ψ is in the range of about 300° or more and about 345° or less. As a result, the acoustic wave is propagated in a state that the energy is concentrated in the vicinity of the piezoelectric layer 3, and therefore, a preferable characteristic of a surface acoustic wave may be obtained.

When ψ is smaller than about 120°, larger than about 165° and smaller than about 300°, or larger than about 345°, the acoustic velocity of at least one of the fast transversal wave and the slow transversal wave is smaller than about 6600 m/s. Accordingly, energy leaks to the A-plane sapphire substrate (support substrate 2) in the vicinity of the anti-resonant frequency, and therefore a preferable impedance characteristic may not be obtained.

(4) Advantages

As described above, in the present preferred embodiment, the acoustic wave device 1 includes the piezoelectric layer 3 having Euler angles of (about 90°, about 90°, about 40°) and the support substrate 2 which is an A-plane sapphire substrate having Euler angles of (about 90°, about 90°, ψ). Here, ψ is about 120° or more and about 165° or less, for example. When ψ is a value within the range of about 120° or more and about 165° or less, as shown in FIG. 2 and FIG. 3, a preferable impedance characteristic at the resonant frequency may be obtained. Accordingly, in the acoustic wave device 1 of the present preferred embodiment, acoustic wave energy does not leak to the side of the support substrate 2, and an acoustic wave may propagate in a state that the energy is concentrated in the vicinity of the piezoelectric layer 3. As a result, a preferable characteristic of a surface acoustic wave may be obtained. That is, the Q factor may be increased.

It is conceivable to use an R-plane sapphire substrate or a C-plane sapphire substrate as the support substrate.

Figure 4:
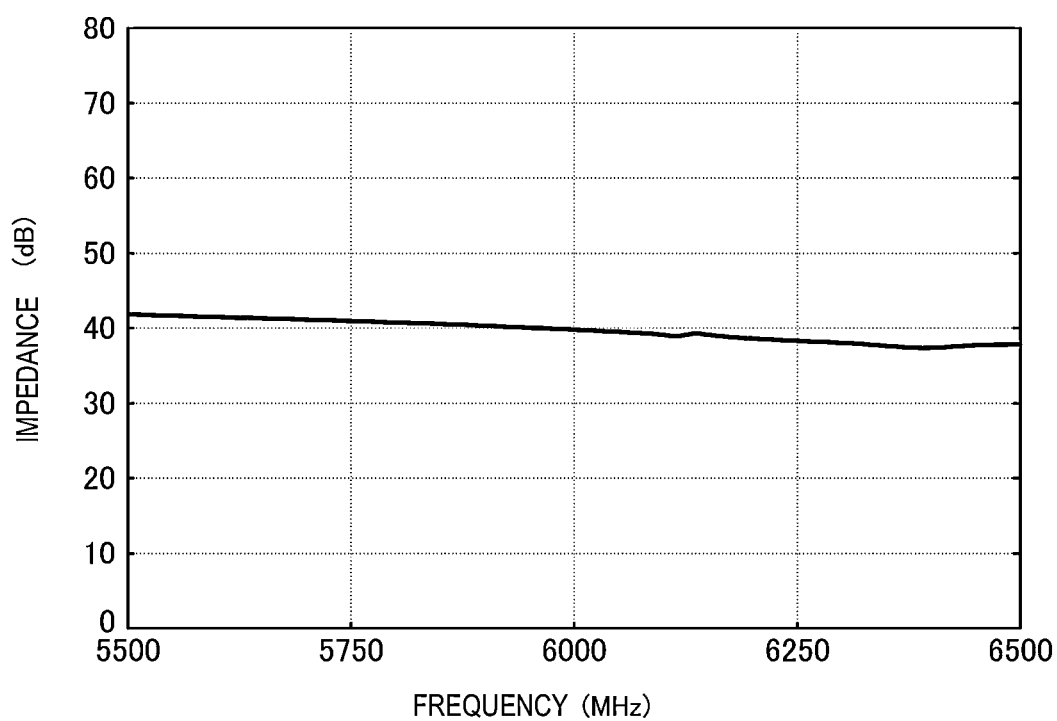
FIG. 4 is a graph describing an impedance characteristic when an R-plane sapphire substrate is used.

For example, an impedance characteristic in a case that an R-plane sapphire substrate (support substrate of comparative example) having Euler angles of (about 0°, about 122.23°, about) 0° is used, instead of the support substrate 2 described in Preferred embodiment 1 is shown in FIG. 4. As shown in FIG. 4, the difference between the maximum and minimum impedance values is not large when, for example, the frequency is about 5500 MHz or more and about 6500 MHz or less. That is, the impedance ratio is small. Accordingly, a preferable impedance characteristic may not be obtained with the support substrate (R-plane sapphire substrate) of the comparative example.

Figure 5:
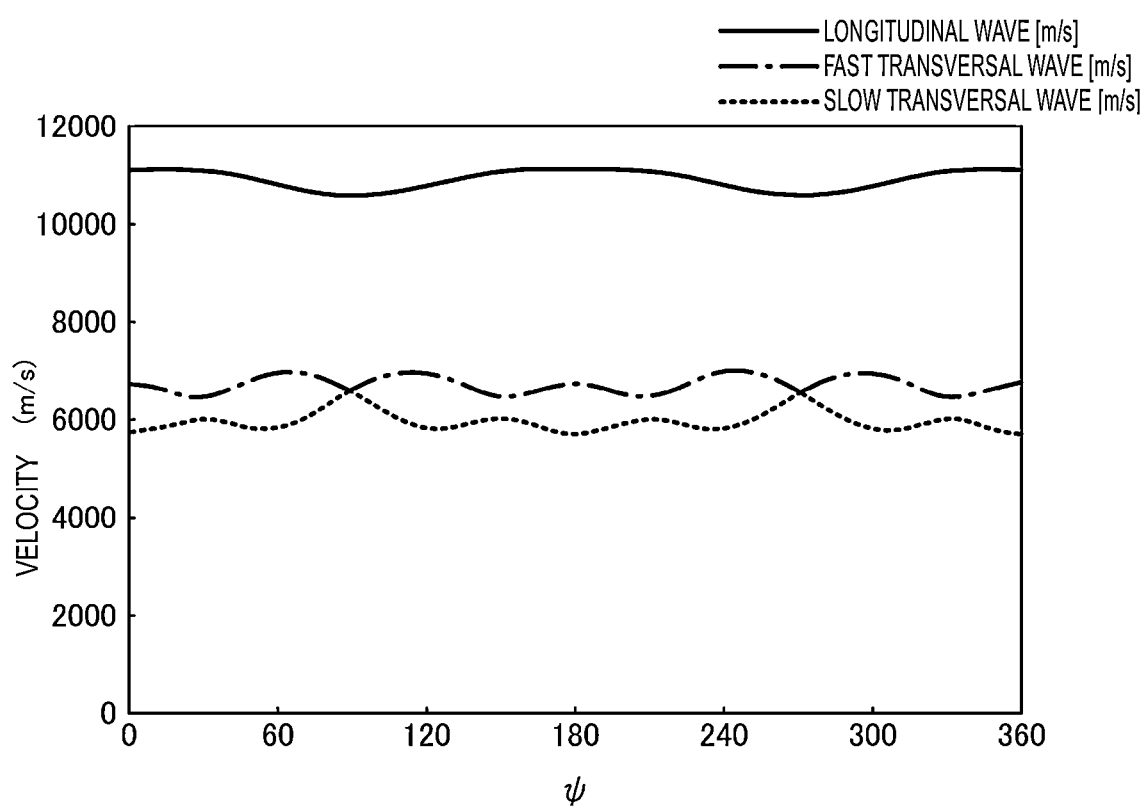
FIG. 5 is a graph describing the bulk wave acoustic velocity when $\psi$ of the R-plane sapphire substrate is varied.

Further, a relationship between the phase velocity and ψ is shown in FIG. 5. The phase velocity is, on other words, the bulk wave acoustic velocity when ψ of the R-plane sapphire substrate (support substrate of comparative example) is varied. In the case that the R-plane sapphire substrate is used, the acoustic velocity of the slow transversal wave is around 6000 m/s at Euler angles (about 0°, about 122.23°, ψ) regardless of the value of ψ. That is, since the acoustic velocity of the slow transversal wave is close to the acoustic velocity at the resonant frequency point, a preferable impedance characteristic may not be obtained because of bulk radiation.

Figure 6:
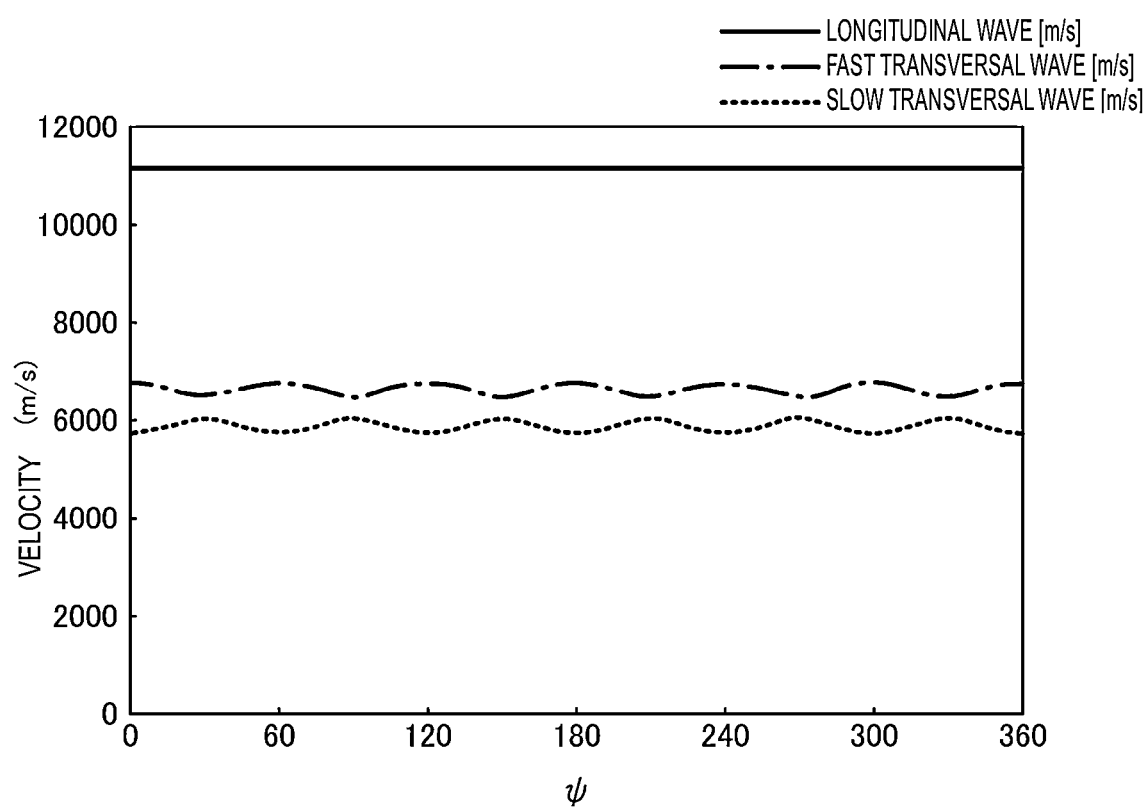
FIG. 6 is a graph describing the bulk wave acoustic velocity when $\psi$ of a C-plane sapphire substrate is varied.

Further, a relationship between the phase velocity and ψ is shown in FIG. 6. The phase velocity is, in other words, the bulk wave acoustic velocity when ψ of the C-plane sapphire substrate is varied. In the case that the C-plane sapphire substrate is used, the acoustic velocity of the slow transversal wave is around 6000 m/s regardless of the value of ψ, similarly to the case of the R-plane sapphire substrate. That is, since the acoustic velocity of the slow transversal wave is close to the acoustic velocity at the resonant frequency point, preferable an impedance characteristic may not be obtained because of the bulk radiation also in the case that the C-plane sapphire substrate is used.

Figure 7:
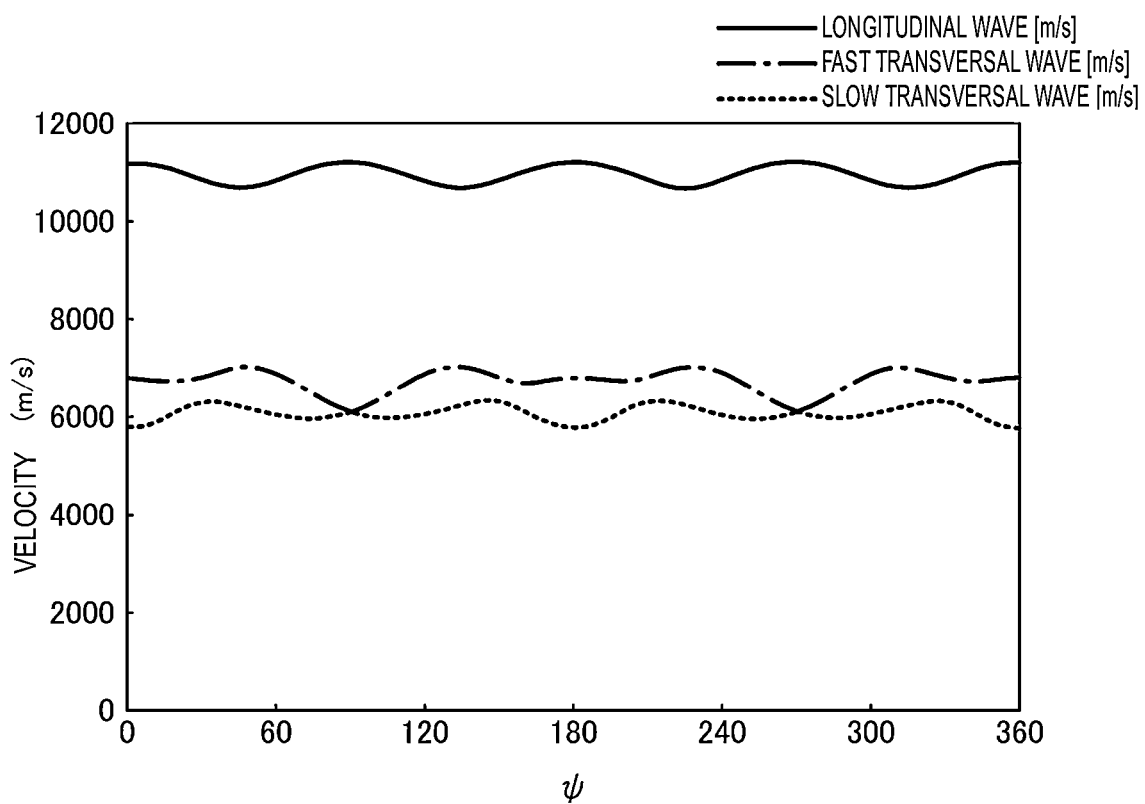
FIG. 7 is a graph describing the bulk wave acoustic velocity when $\psi$ of an m-plane sapphire substrate is varied.

Further, it is also conceivable to use an m-plane sapphire substrate as the support substrate. A relationship between the phase velocity and ψ is shown in FIG. 7. The phase velocity is, in other words, the bulk wave acoustic velocity when ψ of the m-plane sapphire substrate is varied. In the case that the m-plane sapphire substrate is used as the support substrate, the acoustic velocity of the slow transversal wave is around 6000 m/s regardless of the value of ψ, similarly to the cases of the R-plane sapphire substrate and the C-plane sapphire substrate. That is, since the acoustic velocity of the slow transversal wave is close to the acoustic velocity at the resonant frequency point, a preferable impedance characteristic may not be obtained because of the bulk radiation also in the case that the m-plane sapphire substrate is used.

Accordingly, the acoustic wave energy leaks to the side of the substrate when an acoustic wave propagate through the C-plane sapphire substrate, the R-plane sapphire substrate, and the m-plane sapphire substrate. However, using the A-plane sapphire substrate as the support substrate 2 makes it possible for the acoustic wave to propagate without leakage of the acoustic wave energy to the side of the support substrate 2.

Further, in the acoustic wave device 1 according to the present preferred embodiment, when the wavelength of the acoustic wave determined by the electrode finger period of the IDT electrode 4 is defined as λ, the thickness of the piezoelectric layer 3 is about 1λ or less. With this, a plate wave may be excited in the acoustic wave device 1 according to the present preferred embodiment.

Further, in the acoustic wave device 1 according to the present preferred embodiment, the acoustic wave is a plate wave. With this, the acoustic wave device 1 according to the present preferred embodiment may be used as an acoustic wave device using a plate wave.

The preferred embodiment described above is merely one of various preferred embodiments of the present invention. The preferred embodiment described above may be variously modified in accordance with design or the like as long as the advantageous effects of the present invention may be achieved.

(5) Modifications

Hereinafter, modifications of preferred embodiments of the present invention will be described. Note that the modifications described below may be applied by appropriately combining with the preferred embodiment described above.

(5.1) Modification 1

As Modification 1 of the present preferred embodiment, an acoustic wave device 1A may further include, as illustrated in FIG. 8, an intermediate layer 5 as compared with the acoustic wave device 1 of the above-described preferred embodiment.

The intermediate layer 5 is, for example, a silicon oxide layer and is provided between the support substrate 2 and the piezoelectric layer 3. In other words, the intermediate layer 5 is laminated on the first main surface 21 of the support substrate 2, and the piezoelectric layer 3 is laminated on the intermediate layer 5. The thickness of the intermediate layer 5 is, for example, about 50 nm. By providing the intermediate layer 5, it is possible to improve the frequency-temperature characteristics of the acoustic wave device 1A. Note that the material of the intermediate layer 5 may be, for example, silicon nitride, aluminum nitride or the like in addition to silicon oxide.

Figure 9:
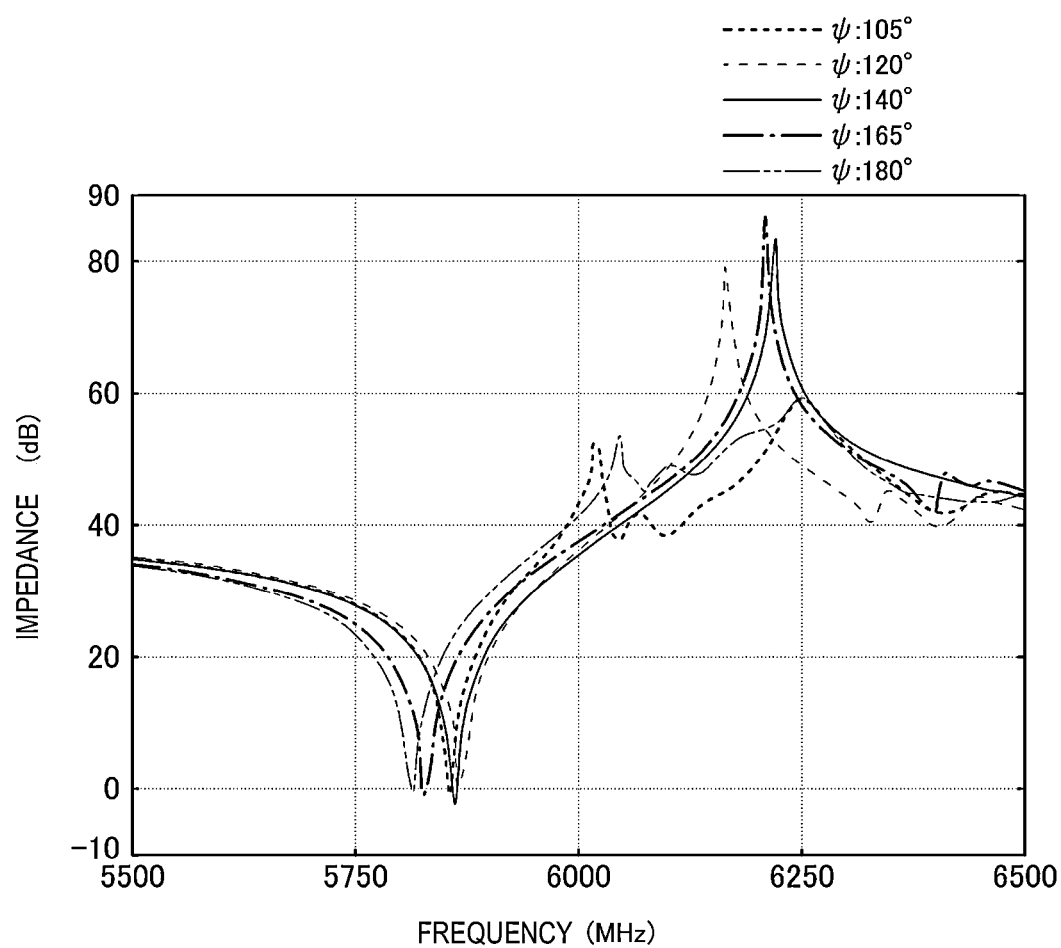
FIG. 9 is a graph describing an impedance characteristic of the acoustic wave device.

An impedance characteristic of the acoustic wave device 1A in a case that the acoustic wave device 1A is used as a one-port resonator and that the angle of ψ which is one element of Euler angles of the support substrate 2 is varied is shown in FIG. 9. In the present modification, the impedance characteristics when ψ is about 105°, about 120°, about 140°, about 165°, and about 180° are shown in FIG. 9.

As described above, the impedance ratio is obtained with the equation "impedance ratio=(20×log$_{10}$|Z1|)−(20×log$_{10}$|Z2|)". Z2 is the impedance at the resonant frequency of the acoustic wave device 1 and corresponds to the maximum value of the impedance characteristic. Z1 is the impedance at the anti-resonant frequency of the acoustic wave device 1 and corresponds to the maximum value of the impedance characteristic.

In FIG. 9, when ψ is about 105° and about 180°, the impedance ratio is about 53 dB. When ψ is about 120°, the impedance ratio is about 80 dB, when ψ is about 140°, the impedance ratio is about 83 dB, and when ψ is about 165°, the impedance ratio is about 85 dB. That is, when ψ is in the range of about 120° or more and about 165° or less, a value around 80 dB may be obtained as the impedance ratio. Accordingly, when ψ is in the range of about 120° or more and about 165° or less, a preferable impedance characteristic may be obtained. That is, a preferable characteristic of a surface acoustic wave may be obtained.

Here, the support substrate 2 is, for example, made of A-plane sapphire and, therefore, defines and functions as a high acoustic velocity substrate. The intermediate layer 5 is a silicon oxide layer, for example, and therefore defines and functions as a low acoustic velocity film. In the high acoustic velocity substrate, the acoustic velocity of a bulk wave propagating through the high acoustic velocity substrate is higher than the acoustic velocity of an acoustic wave propagating through the piezoelectric layer 3. In the low acoustic velocity film, the acoustic velocity of the bulk wave propagating through the low acoustic velocity film is lower than the acoustic velocity of the bulk wave propagating through the piezoelectric layer 3.

Accordingly, the support substrate 2 of the acoustic wave device 1A confines the surface acoustic wave in a portion where the piezoelectric layer 3 and the intermediate layer 5 (low acoustic velocity film) are laminated and prevents the surface acoustic wave from leaking to a structure below the support substrate 2.

An appropriate material, through which a bulk wave propagates slower than a bulk wave propagating through the piezoelectric layer 3, may be used for a material of the low acoustic velocity film being the intermediate layer 5. For example, silicon oxide, glass, silicon oxynitride, tantalum oxide, a compound obtained by adding fluorine, carbon, or boron to silicon oxide, or a medium including these materials as a main component may be used.

The intermediate layer 5 provided between the piezoelectric layer 3 and the support substrate 2 is not limited to one layer. A plurality of intermediate layers 5 may be provided between the piezoelectric layer 3 and the support substrate 2. That is, at least one intermediate layer 5 may be provided between the piezoelectric layer 3 and the support substrate 2, or no intermediate layer 5 may be provided as in the preferred embodiment described above. That is, the piezoelectric layer 3 may directly or indirectly be provided on the support substrate 2.

(5.2) Modification 2

At least one high acoustic impedance layer and at least one low acoustic impedance layer may be provided, as intermediate layers, between the piezoelectric layer 3 and the support substrate 2. Here, the high acoustic impedance layer is a layer in which the acoustic impedance is higher than that of the low acoustic impedance layer. For example, as illustrated in FIG. 10, three high acoustic impedance layers 51 and three low acoustic impedance layers 52 may be provided between the piezoelectric layer 3 and the support substrate 2.

Hereinafter, for convenience of description, the three high acoustic impedance layers 51 may be referred to as a first high acoustic impedance layer 511, a second high acoustic impedance layer 512, and a third high acoustic impedance layer 513 in this order from the first main surface 21 of the support substrate 2. The three low acoustic impedance layers 52 may be referred to as a first low acoustic impedance layer 521, a second low acoustic impedance layer 522, and a third low acoustic impedance layer 523 in this order from the first main surface 21 of the support substrate 2.

In an acoustic wave device 1B, the first high acoustic impedance layer 511, the first low acoustic impedance layer 521, the second high acoustic impedance layer 512, the second low acoustic impedance layer 522, the third high acoustic impedance layer 513, and the third low acoustic impedance layer 523 are disposed in this order from the side of the support substrate 2. Accordingly, in the acoustic wave device 1B, an acoustic wave (plate wave) from the piezoelectric layer 3 may be reflected at each of an interface between the third low acoustic impedance layer 523 and the third high acoustic impedance layer 513, an interface between the second low acoustic impedance layer 522 and the second high acoustic impedance layer 512, and an interface between the first low acoustic impedance layer 521 and the first high acoustic impedance layer 511.

The material of the plurality of high acoustic impedance layers 51 is, for example, Pt (platinum). Further, the material of the plurality of low acoustic impedance layers 52 is, for example, silicon oxide. Since each of the three high acoustic impedance layers 51 is made of Pt, the acoustic wave device 1B includes three conductive layers.

The material of the plurality of high acoustic impedance layers 51 is not limited to Pt (platinum) and may be, for example, a metal such as W (tungsten) or Ta (tantalum). The acoustic wave device 1B is not limited to the example in which the high acoustic impedance layer 51 is a conductive layer, and the low acoustic impedance layer 52 may be a conductive layer.

The materials of the plurality of high acoustic impedance layers 51 are not limited to being the same as each other and may be, for example, different from each other. The materials of the plurality of low acoustic impedance layers 52 are not limited to being the same as each other and may be, for example, different from each other.

The number of each of the high acoustic impedance layers 51 and the low acoustic impedance layers 52 may be, for example, two or four or more. The number of the high acoustic impedance layers 51 may be different from the number of the low acoustic impedance layers 52. In the acoustic wave device 1B, at least one high acoustic impedance layer 51 and at least one low acoustic impedance layer 52 may overlap with each other in the thickness direction D1 of the support substrate 2.

Also in the case in which at least one high acoustic impedance layer 51 and at least one low acoustic impedance layer 52 are provided between the piezoelectric layer 3 and the support substrate 2, a preferable impedance characteristic may be obtained when $\psi$, which is one element of Euler angles of the support substrate 2, is in the range of about 120° or more and about 165° or less, for example. That is, a preferable characteristic of a surface acoustic wave may be obtained.

(5.3) Modification 3

In the preferred embodiment described above, Euler angles of the piezoelectric layer 3 are an orientation determined within the range of (about 90°±5°, about 90°±5°, about 40°±) 20° but are not limited thereto. It is sufficient that Euler angles of the piezoelectric layer 3 are an orientation in which a longitudinal wave is excited as a dominant surface acoustic wave. For example, the orientation in which a longitudinal wave is excited as a dominant surface acoustic wave in the piezoelectric layer 3 includes an orientation determined within the range of (about 0°±5°, about 35°±20°, about 90°±20°) and an orientation determined within the range of (about 0°±5°, about 85°±20°, about 90°±20°) in addition to an orientation determined within the range of (about 90°±5°, about 90°±5°, about 40°±20°).

Alternatively, Euler angles of the piezoelectric layer 3 may be an orientation crystallographically equivalent to Euler angles determined within any of the ranges of (about 90°±5°, about 90°±5°, about 40°±20°) and (about 0°±5°, about 35°±20°, about 90°±20°).

(5.4) Modification 4

The material of the piezoelectric layer 3 is not limited to $LiNbO_3$. The material of the piezoelectric layer 3 may be, for example, $LiTaO_3$ (lithium tantalate). That is, the piezoelectric layer 3 may be a Y-cut X-propagation $LiNbO_3$ piezoelectric single crystal or a piezoelectric ceramics. For example, in a piezoelectric layer made of $LiNbO_3$ of which Euler angles are (about 0°, about 130°, about 0°) has a crystal orientation allowing an acoustic wave, in which the SH wave is dominant, to be excited, but the acoustic velocity of the SH wave is lower than that of the longitudinal wave. Accordingly, by setting ψ, which is one element of Euler angles of the A-plane sapphire (support substrate 2), within the range of about 120° or more and about 165° or less, a preferable impedance characteristic may be obtained. That is, a preferable characteristic of a surface acoustic wave may be obtained.

The single crystal material and the cut-angles of the piezoelectric layer 3 may be appropriately determined in accordance with, for example, the required specifications of a filter (filter characteristics such as a bandpass characteristic, an attenuation characteristic, temperature characteristics, and a band width) and the like.

(5.5) Modification 5

In the preferred embodiment described above, the acoustic wave device 1 is described as a one-port resonator. However, the application of the acoustic wave device 1 is not limited to the one-port resonator.

The acoustic wave device 1 may be a multi-port resonator, for example. The acoustic wave device 1 may be a filter, a duplexer, and a multiplexer by combining a plurality of resonators, for example.

As described above, an acoustic wave device (1; 1A; 1B) according to a preferred embodiment of the present invention includes the support substrate (2), the piezoelectric layer (3), and the IDT electrode (4). The piezoelectric layer (3) is directly or indirectly provided on the support substrate (2). The IDT electrode (4) includes the plurality of electrode fingers (41) and is provided on the main surface (31) of the piezoelectric layer (3). The thickness of the piezoelectric layer (3) is about 1λ or less when the wavelength of an acoustic wave determined by the electrode finger period of the IDT electrode (4) is defined as λ. The support substrate (2) is an A-plane sapphire substrate.

With this configuration, since the A-plane sapphire substrate is used as the support substrate (2), a preferable impedance characteristic may be obtained when the main component of a propagating acoustic wave is a longitudinal wave. Accordingly, it is possible to reduce energy loss when the longitudinal wave propagates through the piezoelectric layer (3).

In an acoustic wave device (1; 1A; 1B) according to a preferred embodiment of the present invention, the piezoelectric layer (3) is made of lithium tantalate or lithium niobate. Euler angles of the piezoelectric layer (3) are an orientation determined in any of the ranges of, or an orientation crystallographically equivalent to Euler angles determined in any of the ranges of (about 90°±5°, about 90°±5°, about 40°±20°), (about 0°±5°, about 35°±20°, about 90°±20°), and (about 0°±5°, about 85°±20°, about 90°±20°).

With this configuration, the main component of a propagating acoustic wave may be a longitudinal wave.

In an acoustic wave device (1; 1A; 1B) according to a preferred embodiment of the present invention, the acoustic wave propagating through the piezoelectric layer (3) includes a longitudinal wave.

According to this configuration, the energy loss of a propagating longitudinal wave may be reduced.

In an acoustic wave device (1; 1A; 1B) according to a preferred embodiment of the present invention, Euler angles of the support substrate (2) are an orientation determined by (about 90°±5°, about 90°±5°, ψ), ψ being in the range of about 120° or more and about 165° or less. Alternatively, Euler angles of the support substrate (2) are an orientation crystallographically equivalent to the orientation determined by Euler angles of (about 90°±5°, about 90°±5°, ψ), ψ being in the range of about 120° or more and about 165° or less.

With this configuration, a preferable impedance characteristic may be obtained when the main component of a propagating acoustic wave is a longitudinal wave.

An acoustic wave device (1A; 1B) according to a preferred embodiment of the present invention further includes at least one intermediate layer (5; 51; 52) between the support substrate (2) and the piezoelectric layer (3).

With this configuration, in the case that the intermediate layer (5; 51; 52) is further included, a preferable impedance characteristic may be obtained.

In an acoustic wave device (1A; 1B) according to a preferred embodiment of the present invention, the at least one intermediate layer (5; 51; 52) includes a silicon oxide layer (5; 52).

With this configuration, it is possible to obtain a preferable impedance characteristic while improving temperature characteristics when the main component of a propagating acoustic wave is a longitudinal wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer provided directly or indirectly on the support substrate; and
   an IDT electrode including a plurality of electrode fingers and provided on a main surface of the piezoelectric layer; wherein
   a thickness of the piezoelectric layer is about 1λ or less when a wavelength of an acoustic wave determined by an electrode finger period of the IDT electrode is defined as λ;
   the piezoelectric layer is made of lithium tantalate or lithium niobate;
   Euler angles of the piezoelectric layer are an orientation determined in any of ranges of, or an orientation crystallographically equivalent to Euler angles determined in any of ranges of (about 90°±5°, about 90°±5°, about 40°±20°), (about 0°±5°, about 35°±20°, about 90°±20°), and (about 0°±5°, about 85°±20°, about 90°±20°); and
   the support substrate is an A-plane sapphire substrate.

2. The acoustic wave device according to claim 1, wherein an acoustic wave propagating through the piezoelectric layer includes a longitudinal wave.

3. The acoustic wave device according to claim 1, wherein Euler angles of the support substrate are an orientation determined by (about 90°±5°, about 90°±5°, ψ), ψ being in a range of about 120° or more and about 165° or less, or Euler angles of the support substrate are an orientation crystallographically equivalent to an orientation determined by (about 90°±5°, about 90°±5°, ψ), ψ being in the range of about 120° or more and about 165° or less.

4. The acoustic wave device according to claim 1, further comprising at least one intermediate layer between the support substrate and the piezoelectric layer.

5. The acoustic wave device according to claim 4, wherein the at least one intermediate layer includes a silicon oxide layer.

6. The acoustic wave device according to claim 1, wherein the support substrate has a rectangular or substantially rectangular shape.

7. The acoustic wave device according to claim 1, wherein the piezoelectric layer is made of an X-cut Y-propagation lithium niobate piezoelectric single crystal.

8. The acoustic wave device according to claim 1, wherein the wavelength of the acoustic wave is about 1 μm and the thickness of the piezoelectric layer 3 is about 0.2 μm.

9. The acoustic wave device according to claim 1, wherein the IDT electrode includes at least one of Al, Cu, Pt, Au, AG, Ti, Ni, Cr, Mo, or W, or an alloy including at least one of Al, Cu, Pt, Au, AG, Ti, Ni, Cr, Mo, or W.

10. The acoustic wave device according to claim 1, a thickness of the IDT electrode is about 50 nm.

11. The acoustic wave device according to claim 4, wherein the intermediate layer has a thickness of about 50 nm.

12. The acoustic wave device according to claim 2, wherein a plurality of the intermediate layers are provided between the support substrate and the piezoelectric layer.

13. The acoustic wave device according to claim 4, wherein the intermediate layer includes at least one high acoustic impedance layer and at least one low acoustic impedance layer.

14. The acoustic wave device according to claim 13, wherein the at least one high acoustic impedance layer includes a plurality of high acoustic impedance layers, and the at least one low acoustic impedance layer includes a plurality of low acoustic impedance layers.

15. An acoustic wave device comprising:
a support substrate;
a piezoelectric layer provided directly or indirectly on the support substrate; and
an IDT electrode including a plurality of electrode fingers and provided on a main surface of the piezoelectric layer; wherein
a thickness of the piezoelectric layer is about $1\lambda$ or less when a wavelength of an acoustic wave determined by an electrode finger period of the IDT electrode is defined as $\lambda$;
the support substrate is an A-plane sapphire substrate; and
Euler angles of the support substrate are an orientation determined by (about 90°±5°, about 90°±5°, ψ), ψ being in a range of about 120° or more and about 165° or less, or Euler angles of the support substrate are an orientation crystallographically equivalent to an orientation determined by (about 90°±5°, about 90°±5°, ψ), ψ being in the range of about 120° or more and about 165° or less.

* * * * *